US012564974B2

(12) United States Patent
Reuter et al.

(10) Patent No.: US 12,564,974 B2
(45) Date of Patent: Mar. 3, 2026

(54) FACTORY INTERFACE WITH REDUNDANCY

(71) Applicant: Applied Materials, Inc., Santa Clara, CA (US)

(72) Inventors: Paul Benjamin Reuter, Austin, TX (US); Kristen Ikeda, Santa Clara, CA (US); Sushant S. Koshti, Sunnyvale, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 680 days.

(21) Appl. No.: 17/884,088

(22) Filed: Aug. 9, 2022

(65) Prior Publication Data

US 2023/0054584 A1 Feb. 23, 2023

Related U.S. Application Data

(60) Provisional application No. 63/234,704, filed on Aug. 18, 2021.

(51) Int. Cl.
| | |
|---|---|
| B25J 21/00 | (2006.01) |
| F24F 3/167 | (2021.01) |
| H05K 13/00 | (2006.01) |

(52) U.S. Cl.
CPC ............. B25J 21/005 (2013.01); F24F 3/167 (2021.01); H05K 13/0061 (2013.01)

(58) Field of Classification Search
CPC .... H01L 21/67196; H01L 21/67; F24F 3/167; B25J 21/005
See application file for complete search history.

(56) References Cited

U.S. PATENT DOCUMENTS

| | | | |
|---|---|---|---|
| 3,972,424 | A | 8/1976 | Levy et al. |
| 5,102,280 | A | 4/1992 | Poduje et al. |
| 6,275,742 | B1 | 8/2001 | Sagues et al. |
| 10,361,104 | B2 | 7/2019 | Assaf et al. |

(Continued)

FOREIGN PATENT DOCUMENTS

| | | |
|---|---|---|
| JP | 2008075135 A | 4/2008 |
| JP | 2013143558 A | 7/2013 |

(Continued)

OTHER PUBLICATIONS

PCT Notification of Transmittal of the International Search Report and the Written Opinion of the International Searching Authority for PCT Application No. PCT/US2022/040632, mailed Dec. 5, 2022, 12 pages.

(Continued)

*Primary Examiner* — Kaitlin S Joerger
(74) *Attorney, Agent, or Firm* — Lowenstein Sandler LLP

(57) ABSTRACT

A substrate processing system for an electronic device manufacturing system can include a factory interface forming an interior volume, and a partition disposed in the factory interface. The partition can divide the interior volume into a first factory interface chamber forming a second interior volume, and a second factory interface chamber forming a third interior volume. The partition can be configured to provide a first sealed environment in the first factory interface chamber and a second sealed environment in the second factory interface chamber.

21 Claims, 11 Drawing Sheets

(56) References Cited

U.S. PATENT DOCUMENTS

| | | | | |
|---|---|---|---|---|
| 11,581,203 | B2* | 2/2023 | Newman | H01L 21/67727 |
| 2006/0056952 | A1* | 3/2006 | Haris | H01L 21/67271 |
| | | | | 414/744.6 |
| 2010/0008748 | A1* | 1/2010 | Godot | H01L 21/67778 |
| | | | | 414/217.1 |
| 2013/0322990 | A1* | 12/2013 | Chen | H01L 21/6773 |
| | | | | 414/217 |
| 2015/0133044 | A1* | 5/2015 | Kumagai | H01L 21/681 |
| | | | | 414/217 |
| 2015/0200122 | A1* | 7/2015 | Eom | H01L 21/6838 |
| | | | | 414/217 |
| 2017/0148654 | A1 | 5/2017 | Paul et al. | |
| 2017/0178933 | A1* | 6/2017 | Ferrara | H01L 21/67201 |
| 2020/0035524 | A1* | 1/2020 | Hsu | C23C 28/023 |
| 2022/0068677 | A1* | 3/2022 | Newman | B65G 47/90 |
| 2023/0031209 | A1* | 2/2023 | Suzuki | H01L 21/67051 |
| 2023/0130947 | A1* | 4/2023 | Penmethsa | H01J 37/3435 |
| | | | | 204/192.12 |
| 2023/0197498 | A1* | 6/2023 | Thanu | H01L 21/68707 |
| | | | | 414/217 |
| 2024/0192653 | A1* | 6/2024 | Unterguggenberger | G06T 17/00 |
| 2024/0282558 | A1* | 8/2024 | Govindasamy | H01J 37/3452 |

FOREIGN PATENT DOCUMENTS

| | | |
|---|---|---|
| JP | 2015146349 A | 8/2015 |
| JP | 2018198305 A | 12/2018 |
| JP | 2020013814 A | 1/2020 |
| KR | 19990065415 A | 8/1999 |
| TW | 202130400 A | 8/2021 |

OTHER PUBLICATIONS

Extended European Search Report for European Application No. 22859124.4, mailed Jun. 4, 2025, 9 Pages.

* cited by examiner

600

Receiving, by a load port, a substrate carrier
610

Positioning the load port door from the closed position to the open position
620

Retrieving, by a factory interface robot, a substrate from the substrate carrier
630

Placing, by factory interface robot, the substrate onto one or more components associated with the factory interface subsystem
640

700

Retrieve, by a first factory interface robot, a substrate from a substrate carrier
710

Transfer the substrate from the first factory interface robot to a second factory interface robot
720

Place the substrate, via the second factory interface robot, inside a load lock
730

FACTORY INTERFACE WITH REDUNDANCY

RELATED APPLICATION

This application claims the benefit of U.S. Provisional Application No. 63/234,704, filed Aug. 18, 2021, the entire content of which is hereby incorporated by reference.

TECHNICAL FIELD

Embodiments of the present disclosure relate, in general, to systems and methods for enabling multiple sub-systems within the factory interface to facilitate redundancy in the event of component failure.

BACKGROUND

An electronic device manufacturing system can include one or more tools or components for transporting and manufacturing substrates. Such tools or components can include a factory interface connected to a load lock and/or transfer chamber. The factory interface can include a factory interface robot configured to transfer substrates between substrate carriers docked at a load port and the load lock. The factory interface can further maintain an at or near atmospheric-pressure inert-gas environment to facilitate transferring the substrates to and from the load lock. However, if any component fails, such as the factory interface robot, an air utility line configured to provide air to the factory interface, a vacuum utility line configured to provide a vacuum to the factory interface, etc., the entire manufacturing system can be shut down to conduct maintenance. Accordingly, improved electronic device manufacturing systems, apparatus, and methods for providing redundancy in case of component failure are desired.

SUMMARY

Some of the embodiments described cover a substrate processing system for an electronic device manufacturing system. The substrate processing system includes a factory interface forming an interior volume, and a partition disposed in the factory interface. The partition divides the interior volume into a first factory interface chamber forming a second interior volume, and a second factory interface chamber forming a third interior volume. The partition is configured to provide a first sealed environment in the first factory interface chamber and a second sealed environment in the second factory interface chamber.

In some embodiments, an electronic device manufacturing system is covered. The electronic device manufacturing system comprises a first factory interface subsystem, a second factory interface subsystem, a partition comprising an opening and positioned so as to be between the first factory interface subsystem and the second factory interface subsystem, a first load lock coupled to a backside of the first factory interface subsystem, a second load lock coupled to a backside of the second factory interface subsystem, a first factory interface robot disposed within an interior volume of the first factory interface subsystem, and a second factory interface robot disposed within an interior volume of the second factory interface subsystem. The first factory interface robot can be configured to transfer a substrate to the second factory interface robot via the opening in the partition.

In some embodiments, a method for transporting substrates from a first factory interface robot to a second factory interface robot includes retrieving, by an end effector of the first factory interface robot, a substrate from a substrate carrier. The method further includes positioning the substrate on a substrate pass-through station situated in a first factory subsystem. The method further includes retrieving, by a second end effector of the second factory interface robot, the substrate from the substrate pass-through station, wherein the second factory interface robot retrieves the substrate by passing the end effector through an opening in a partition separating the first factory interface robot and the second factory interface robot.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1A:
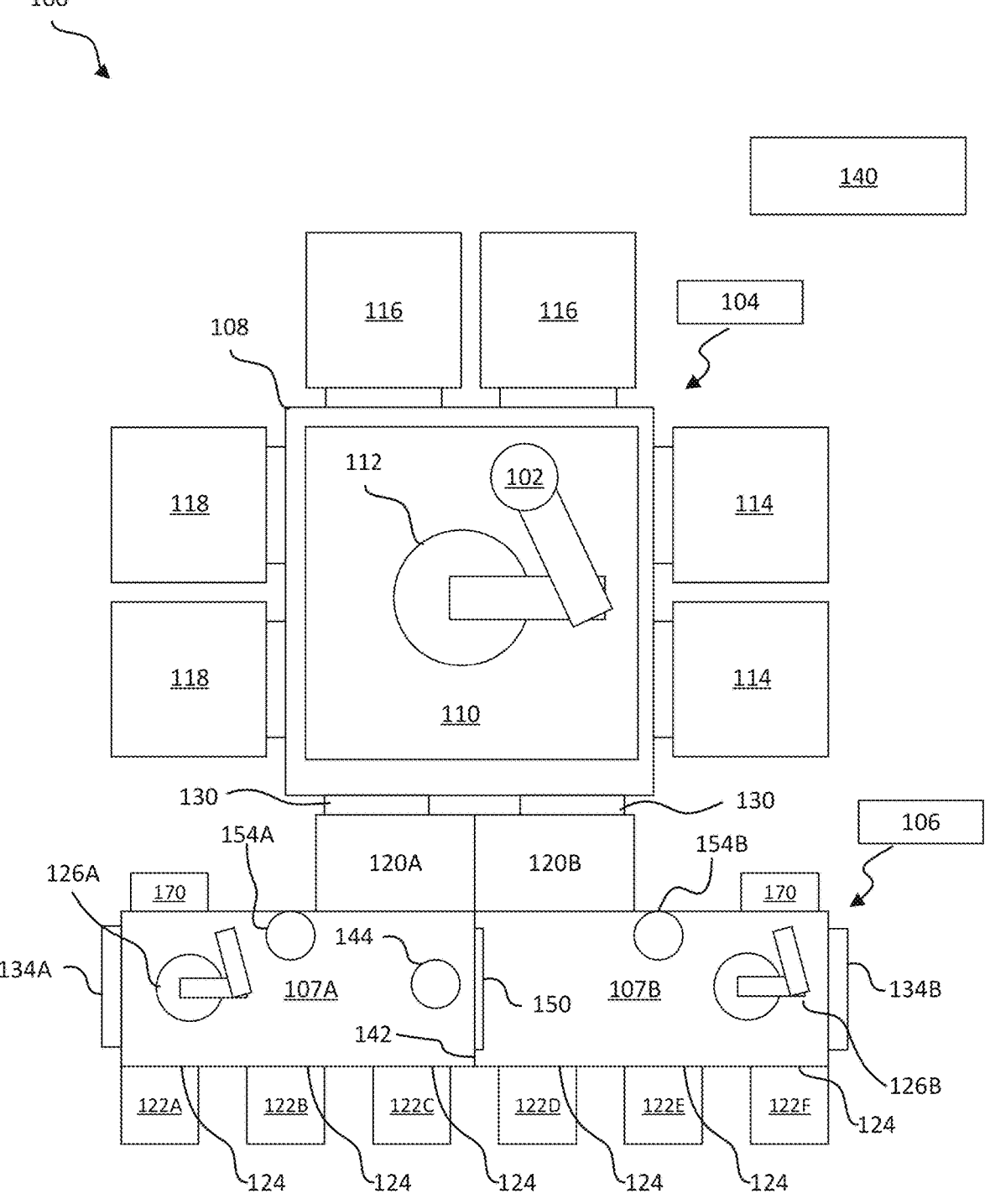
FIG. 1A is a top schematic view of an example electronic device manufacturing system, according to aspects of the present disclosure.

Embodiments described herein are related to systems and methods for enabling multiple sub-systems within a factory interface to facilitate redundancy in the event of component failure. Embodiments cover multiple different designs for independent sub-systems within a factory interface, each sub-system capable of providing a controlled environment to transfer substrates between load locks and substrate carriers docked on load ports. Furthermore, floor space in fabrication facilities (fabs) for electronic devices is very costly, and any increase in the footprint of electronic device manufacturing systems can increase the cost of ownership of those electronic device manufacturing systems. Embodiments discussed herein are capable of providing redundancy to factory interfaces (e.g., equipment front end modules (EFEMs)) via multiple sub-systems having independent load locks, load ports, factory interface robots, and internal environments that do not increase the footprint and overall cost of ownership of electronic device manufacturing systems.

In some embodiments, a factory interface is split into two smaller factory interfaces (e.g., a left and right factory interface) that share a common structure using a partition, each smaller factory interface forming a factory interface chamber. The partition can be positioned between the two smaller factory interfaces (hereafter "first factory interface subsystem" and "second factory interface subsystem") to form each factory interface chamber. Each factory interface subsystem (e.g., factory interface chamber) can interact with a respective load lock. In particular, each of the two factory interface chambers can include a respective factory interface robot configured to position substrates from a substrate carrier (coupled to a load port) to a respective load lock, and vice versa. Each factory interface chamber can maintain an independent compartment housing electronic systems (e.g., servers, air conditioning units, etc.), utility cables, gas or air recirculation, gas delivery, gas exhausting, etc. to provide control capabilities to the respective subsystem, as well as independent sealed environments. For example, the first factory interface subsystem can maintain a first sealed environment (e.g., a slightly positive pressure non-reactive gas environment) and the second factory interface subsystem can maintain a second sealed environment.

In some embodiments, the partition can include an opening to allow one factory interface robot to transfer one or more substrates to the other factory interface robot, and/or vice-versa. The partition can include one or more pass-through doors located on either side of the partition or integrated into the partition. In the closed position, the pass-through door can provide an airtight seal to maintain the first seal environment in the first factory interface subsystem and the second seal environment in the second factory interface subsystem. In the open position, the pass-through door can expose the pass-through area created by the opening in the partition to permit the first factory interface robot and the second factory interface robot to handoff substrates between each other.

In some embodiments, a factory operator can access the factory interface robots, the load ports, the load locks, or any other components of one of the factory interface chambers of the factory interface for maintenance or repair while the door of the partition is closed without shutting down the entire factory interface. For example, a factory operator can shut down one factory interface subsystem to perform maintenance on its components while the other factory interface subsystem remains fully operational.

By providing a system that integrates multiple smaller factory interfaces into a single factory interface volume, an electronic device manufacturing system is provided to facilitate redundancy in the event of component failure. Specifically, prior electronic device manufacturing system designs are generally entirely shut down to perform maintenance, resulting in reduced or lost yield and unscheduled downtime. By maintaining one operational smaller factory interface chamber during repairs to another smaller factory interface chamber that shares a common chassis with the factory interface chamber being repaired, the manufacturing system of the present disclosure allows for continued throughput, which can improve overall system yield and/or cost (e.g., fabrication cost, materials cost, packaging cost, shipment cost, etc.).

Embodiments are discussed with reference to factory interfaces that include two independent subsystems (e.g., two separate factory interface chambers) separated by a partition. However, it should be understood that redundancy can be extended, and in some embodiments, three, four or more factory interface subsystems can be used. For example, a factory interface can include three factory interface chambers, where a first partition separates a first factory interface chamber from a second factory interface chamber, and a second partition separates the second factory interface chamber from a third factory interface chamber. Each of the factory interface chambers can include its own factory interface robot, one or more load ports, etc. in embodiments.

Figure 1B:
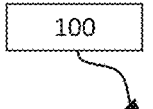
FIG. 1B is a front schematic view of an example electronic device manufacturing system, according to aspects of the present disclosure, according to aspects of the present disclosure.
Figure 1B:
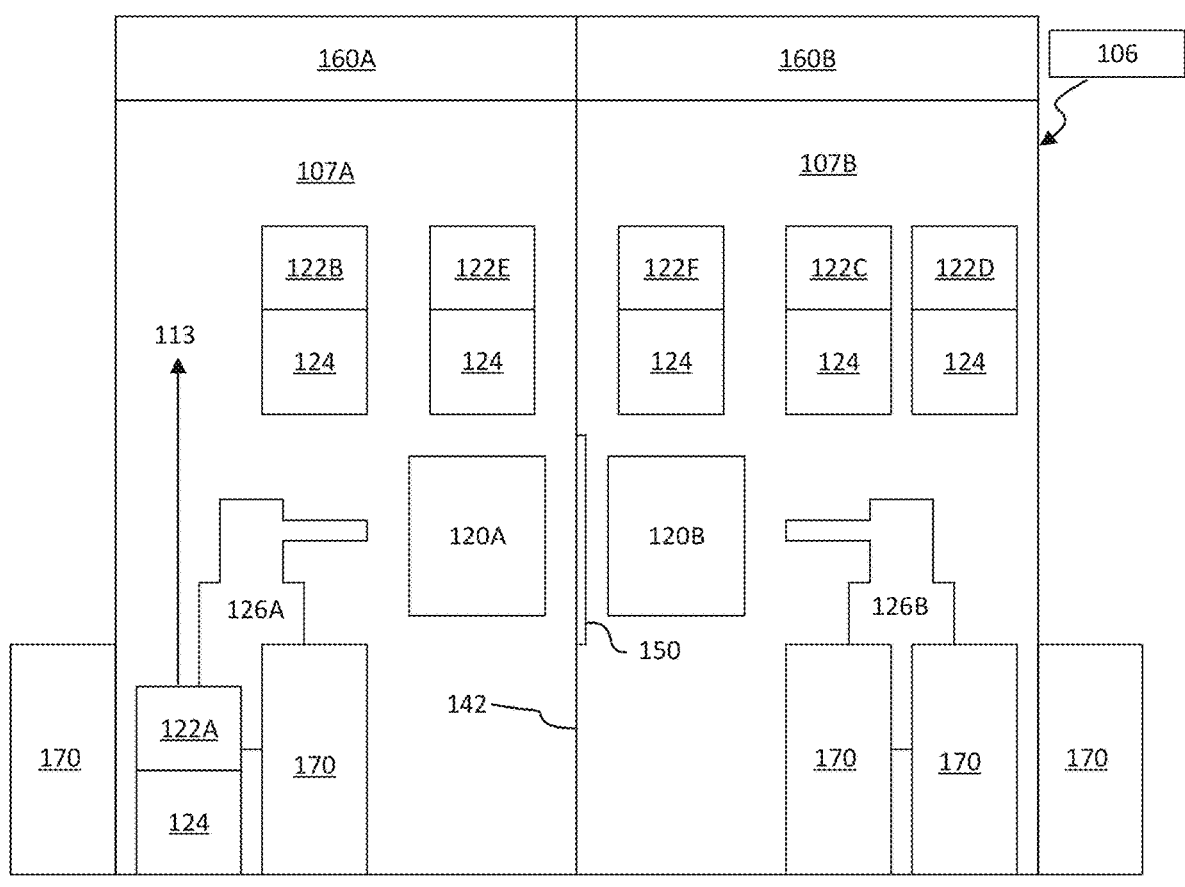
Figure 1C:
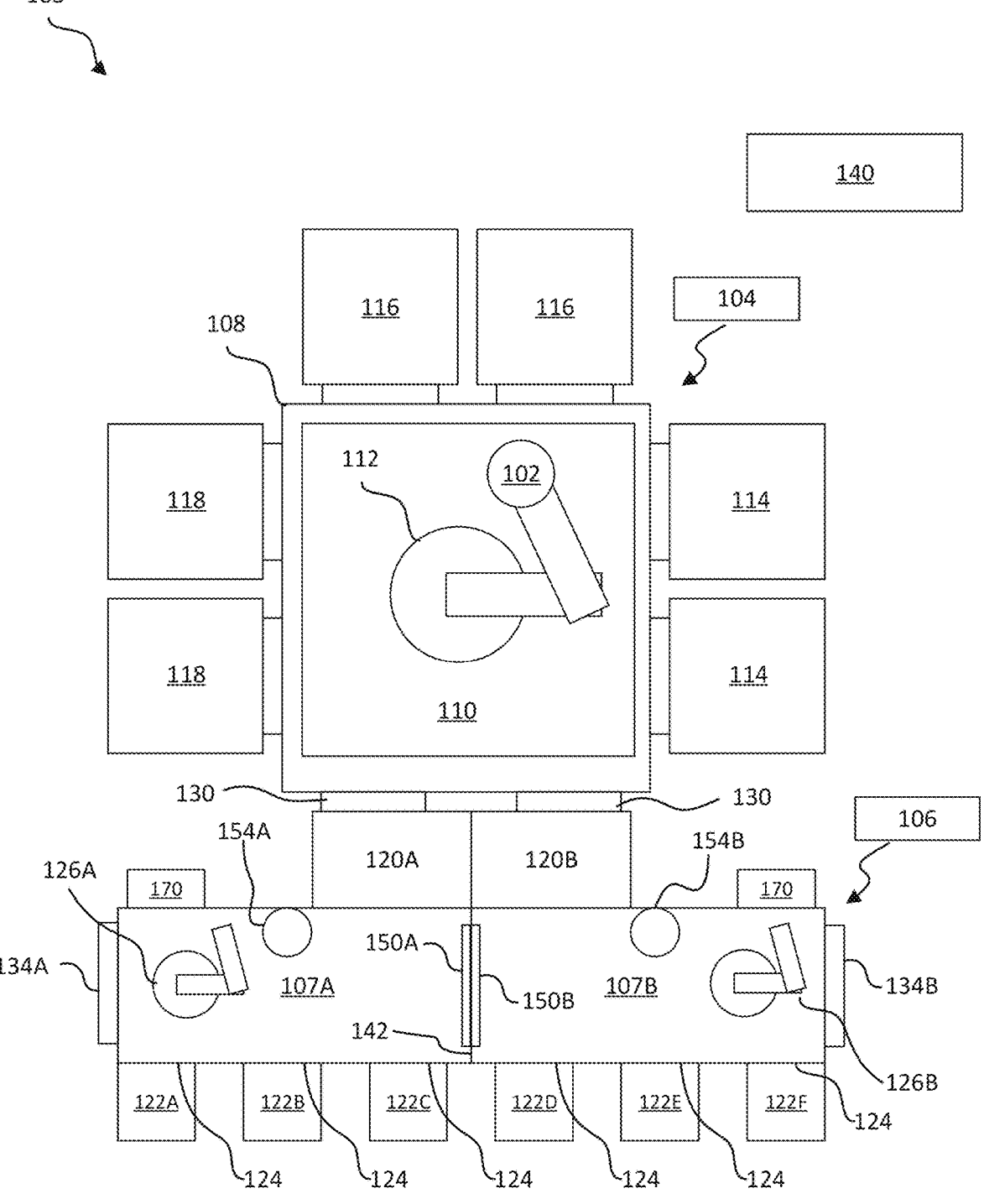
FIG. 1C is a top schematic view of another example electronic device manufacturing system, according to aspects of the present disclosure.
Figure 1D:
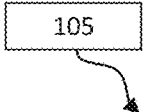
FIG. 1D is a front schematic view of another example electronic device manufacturing system, according to aspects of the present disclosure, according to aspects of the present disclosure.
Figure 1D:
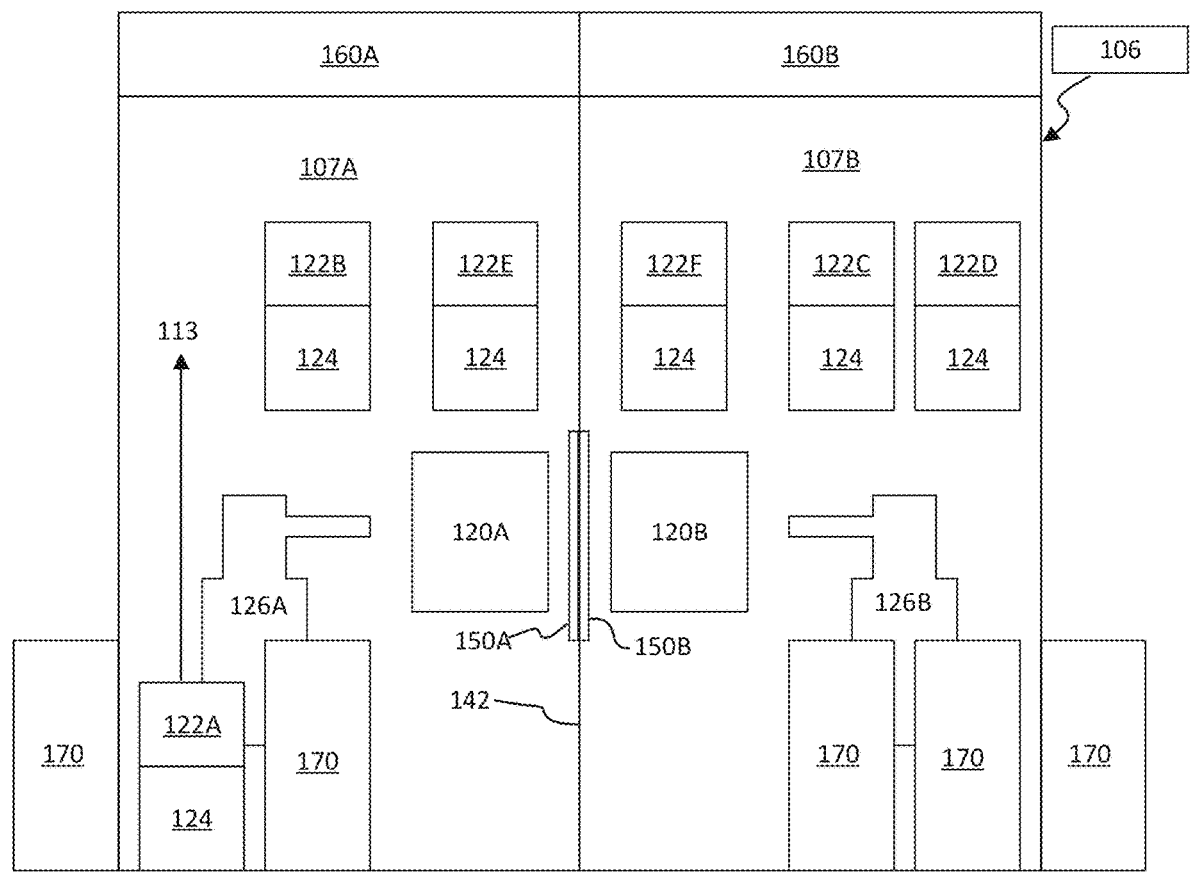

FIGS. 1A-1B describe an electronic device manufacturing system 100 having a factory interface 106 with two factory interface subsystems 107A, 107B, and pass-through door 150. FIG. 1A is a top schematic view of the example electronic device manufacturing system 100, according to aspects of the present disclosure. FIG. 1B is a front schematic view of the example electronic device manufacturing system 100, according to aspects of the present disclosure. FIGS. 1C-1D describe an electronic device manufacturing system 105 having a factory interface 106 with two factory interface subsystems 107A, 107B, and pass-through doors 150A, 150B. FIG. 1C is a top schematic view of an example electronic device manufacturing system 105, according to aspects of the present disclosure. FIG. 1D is a front schematic view of example electronic device manufacturing system 100, according to aspects of the present disclosure. It is noted that FIGS. 1A-1D are used for illustrative purposes, and that different components can be positioned in different location in relation to each view. Additionally, not all components of the factory interface 106 or other components of the device manufacturing system 100, 105 are illustrated.

Figure 2:
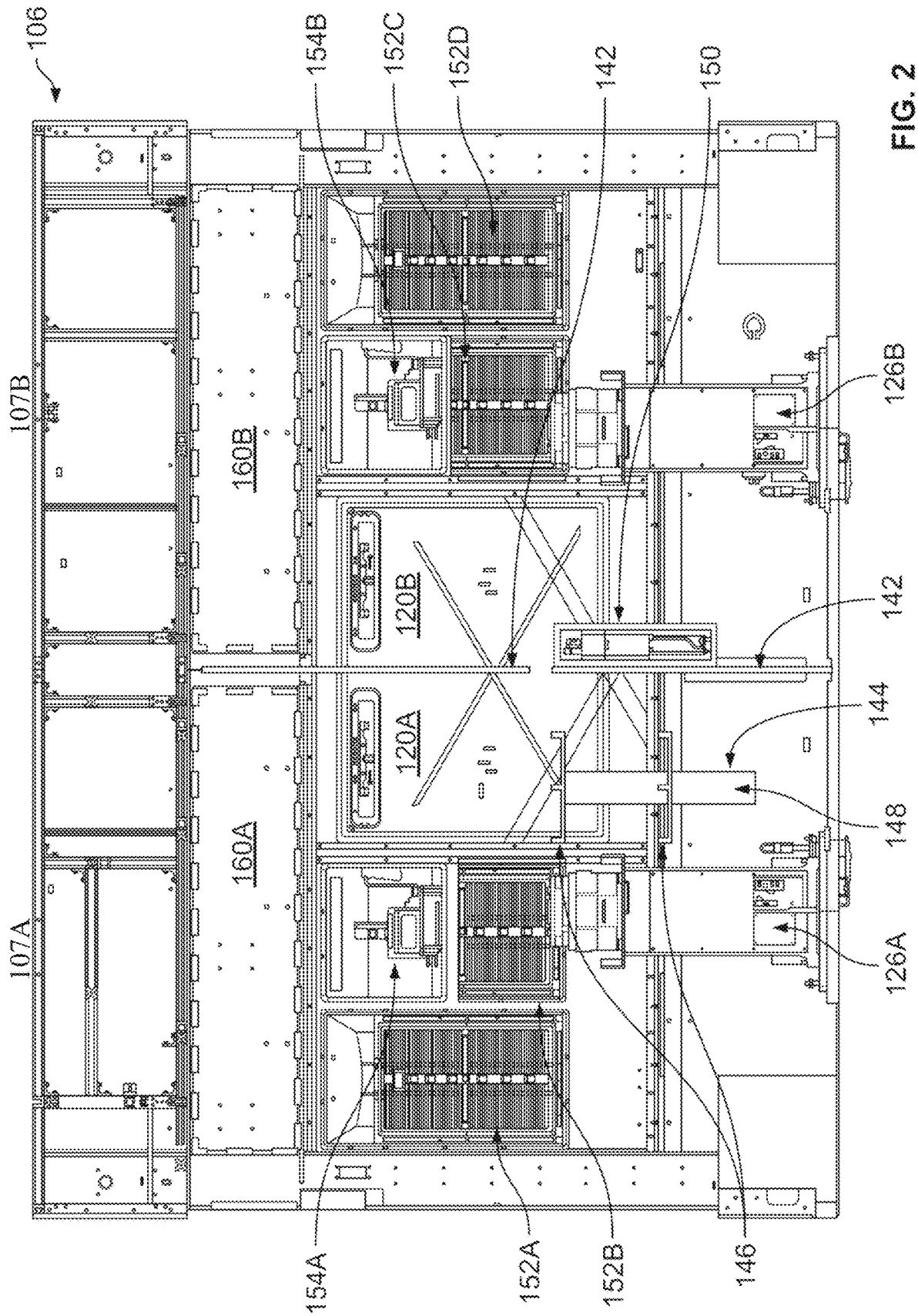
FIG. 2 is a front view of an electronic device manufacturing system, according to aspects of the present disclosure.

FIG. 2 illustrates one embodiment of factory interface 106, which has two factory interface subsystems 107A, 107B separated by partition 142 which includes pass-through door 150 located on the right side of partition 142, where each subsystem 170A, 107B is configured to interact with a respective load lock 120A-B. It is noted that FIG. 2 is used for illustrative purposes, and that different components can be positioned in different location in relation to manufacturing system 100.

Figure 3A:
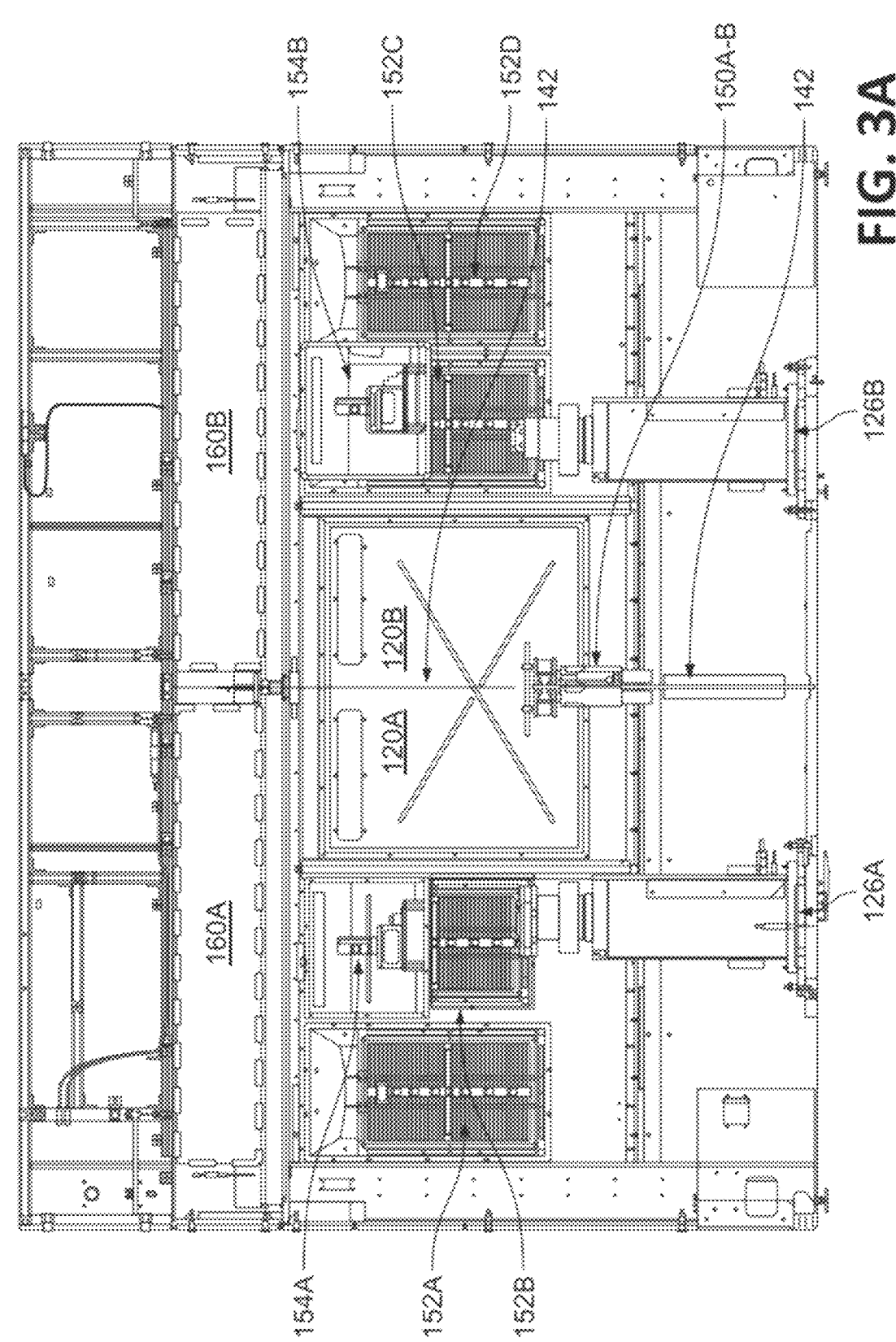
FIG. 3A-B is front view of another electronic device manufacturing system, according to aspects of the present disclosure.
Figure 3B:
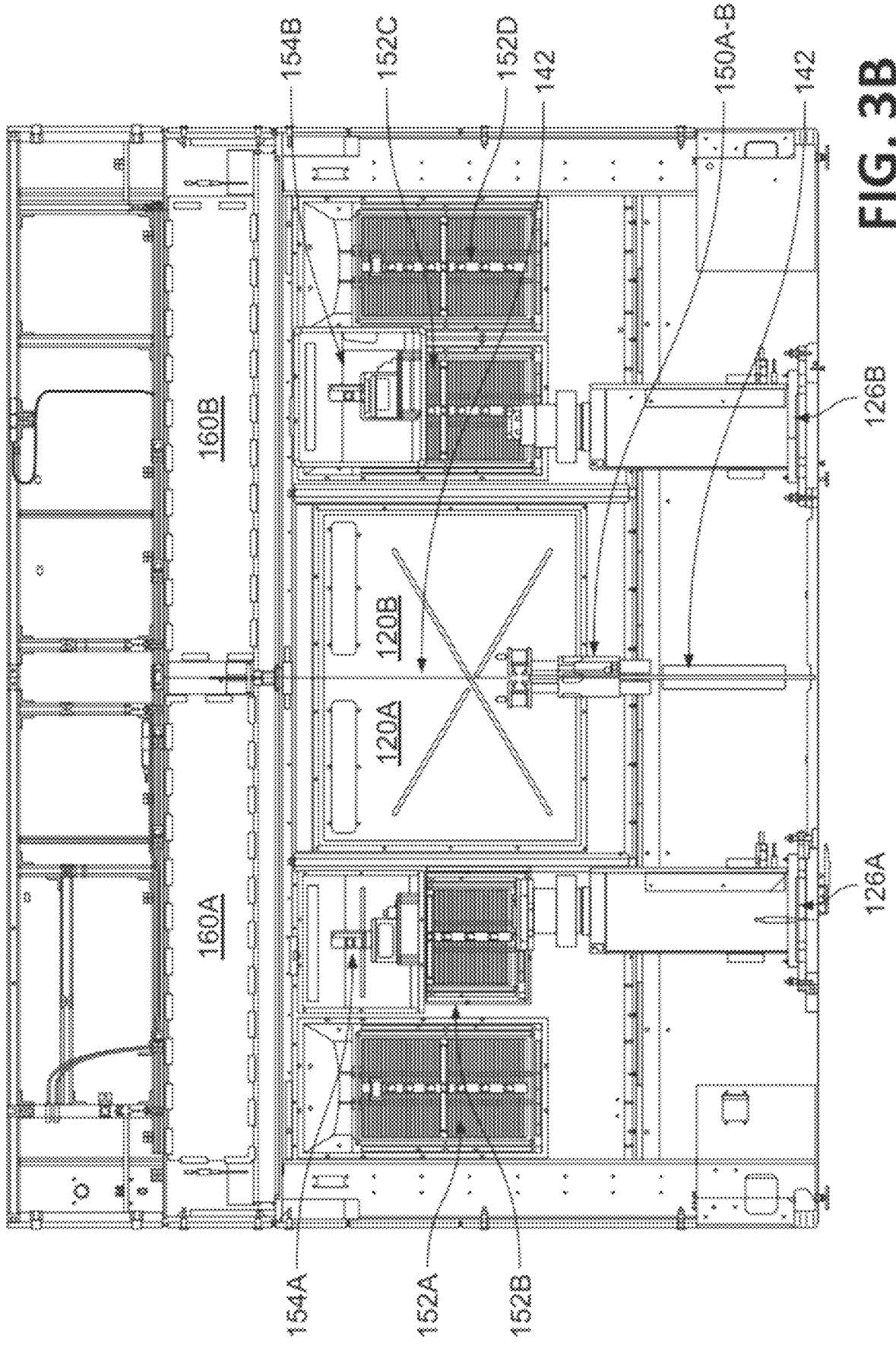

FIGS. 3A-3B illustrate another embodiment of factory interface 106, which has two factory interface subsystems 107A, 107B separated by partition 142 which includes two pass-through doors 150A, 150B located on each side of partition 142, where each subsystem 170A, 107B is configured to interact with a respective load lock 120A-B. FIG. 3A shows the pass-through doors 150A, 150B in the open position, and FIG. 3B shows the pass-through doors 150A-150B in the closed position. It is noted that FIGS. 3A-3B are used for illustrative purposes, and that different components can be positioned in different location in relation to manufacturing system 100.

Referring to FIGS. 1A, 1B, 1C, 1D 2, 3A, and 3B, electronic device manufacturing system 100, 105 (also referred to as an electronics processing system) is configured to perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Electronic device manufacturing system 100, 105 includes a process tool (e.g., a mainframe) 104 and a factory interface 106 coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms where each arm includes one or more end effectors at the end of each arm. The end effector can be configured to handle particular objects, such as wafers. Alternatively, or additionally, the end effector is configured to handle objects such as process kit rings. In some embodiments, transfer chamber robot 112 is a selective compliance assembly robot arm (SCARA) robot, such as a 2 link SCARA robot, a 3 link SCARA robot, a 4 link SCARA robot, and so on.

Factory interface 106 can interact with a respective load lock 120A, 120B via factory interface subsystems 107A, 107B, respectively. Load locks 120A-B can also be coupled to housing 108 and transfer chamber 110. Load locks 120A-B can be configured to interface with, and be coupled to, transfer chamber 110 on one side and factory interface 106A-B, respectively. Each load locks 120A-B can have an environmentally-controlled atmosphere that can be changed from a vacuum environment (wherein substrates can be transferred to and from transfer chamber 110) to at or near atmospheric-pressure inert-gas environment (wherein substrates can be transferred to and from factory interface 106) in some embodiments.

Factory interface 106 can be any suitable enclosure, such as, e.g., an Equipment Front End Module (EFEM). Factory interface 106 can include two subsystems, factory interface subsystem 107A and factory interface subsystem 107B, which can be separated from each other via partition 142. Partition 142 can include one or more pass-through doors 150, 150A, 150B which can provide an airtight seal such that each of factory interface subsystem 107A and factory interface subsystem 107B can maintain individual sealed environments that are sealed off from one another. This will be discussed in further detail below. Factory interface 106 can be configured to receive substrates 102 from substrate carriers 122A-F (e.g., Front Opening Unified Pods (FOUPs)) docked at various load ports 124 of factory interface 106. The load ports 124 can be positioned at a front side of the factory interface 106 at one or more elevations. Factory interface 106 can be configured with any number of load ports 124, which can be located at one or more sides of the factory interface 106 and at the same or different elevations.

As shown in FIG. 1B, 1D load ports 124 can be located at different elevations along the walls of factory interface 106. Elevating the load ports 124 allows for placement of one or more auxiliary components 170 at the base of factory interface 106. Auxiliary components 170 will be explained in more detail below. In some embodiments, one or more auxiliary component 170 can be positioned to either or both sides of the factory interface 106 (as shown in FIG. 1B, 1D), or in one or more locations behind the factory interface 106 (as shown in FIG. 1A, 1C). In some embodiments, as shown in FIG. 1B, 1D, one or more load ports 124 can be located at or near the factory interface base on the front side of factory interface 106, while one or more further load ports 124 can be located at a higher elevation (e.g., approximately two meters from the ground). In some embodiments, one or more substrate carrier elevator 113 can be configured to raise a substrate carrier 122A-F. In some embodiments, the substrate carrier elevator 113 can raise one or more substrate carriers 122A-F to an overhead automation component (not shown). The overhead automation component can deliver the one or more substrate carriers 122A-F to one or more elevated load ports 124. Further, the overhead automation component can remove the one or more substrate carriers 122A-F from the one or more elevated load ports 124. In an example, a factory operator can load a substrate carrier 122A-F onto the substrate carrier elevator 113, engage the elevator to raise the substrate carrier 122A-F to the overhead automation component, engage the overhead automation component to deliver the substrate carrier 122A-F to a load port 124, then engage the overhead automation component to remove the substrate carrier 122A-F from the load port once empty, and engage the elevator to lower the substrate carrier 122A-F.

In some embodiments, at least one load port 124 can be positioned at a lower elevation that is accessible to factory operators who can manually load one or more substrate carriers 122A-F to said load port 124. One or more load ports 124 can be positioned at a higher elevation, where the factory operators can engage the substrate carrier elevator 113 and the overhead automation component to load the one or more substrate carriers 122A-F to the elevated load ports 124. Such a configuration can allow for additional space at the base of the front side of the factory interface, whereby components placed in that space would not increase the operational footprint of the electronic device manufacturing system 100. For example, in some embodiments, auxiliary components 170 can be replaced with load ports 124. For example, four or six load ports 124 can be located at or near the factory interface base on the front side of factory interface 106. In some other embodiments, one or more load ports 124 can be loaded on a sidewall of factory interface 106.

Factory interface robots 126A-B can be configured to transfer substrates 102 between substrate carriers (also referred to as containers) 122A-F and load locks 120A-B. In one embodiment, factory interface subsystem 107A includes factory interface robot 126A and factory interface subsystem 107B includes factory interface robot 126B. For example, factory interface subsystem 107A can include factory interface robot 126A disposed within factory interface 107A at a first side (e.g., left-hand side) of factory interface 106 and factory interface subsystem 107B can include factory interface robot 126B disposed within factory interface 107B at a second side (e.g., right-hand side) of factory interface 106.

In an example, factory interface robot 126A can be configured to transfer substrates 102 between a first set of substrate carriers (e.g., substrate carriers 122A-122C) and load lock 120A. In another example, factory interface robot 126B can be configured to transfer substrates 102 between a second set of substrate carriers (e.g., substrate carriers 122D-122F) and load lock 120B. In other and/or similar embodiments, factory interface subsystems 107A-B are configured to receive replacement parts from replacement parts storage containers, and factory interface robots 126A-B are configured to transport such replacement parts into and out of one or more of the load locks 120A-B. In some embodiments, factory interface robot 126A cannot access load lock 120B and factory interface robot 126B cannot access load lock 120A.

Factory interface robots 126A-B can include one or more robot arms and can each be or include a SCARA robot, a mast-type robot, a lift-type (e.g., scissor lift) robot, or any combination thereof. In some embodiments, factory interface robots 126A-B has more links and/or more degrees of freedom than transfer chamber robot 112. Each of the factory interface robots 126A-B can include actuators or assemblies that can adjust a height of one or more of the robot arms of the respective factory interface robots 126A-B, enabling the factory interface robots 126A-B to reach carriers connected to load ports at different elevations. Factory interface robots 126A-B can each include one or more end effectors on an end of each robot arm. The end effector(s) can be configured to pick up and handle specific objects, such as wafers. Alternatively, or additionally, the end effector(s) can be configured to handle objects such as process kit rings. Any conventional robot type can be used for factory interface robots 126A-B. Transfers can be carried out in any order or direction.

Factory interface subsystems 107A-B can each be maintained in, e.g., a slightly positive-pressure non-reactive gas environment (using, e.g., nitrogen as the non-reactive gas) in some embodiments. In some embodiments, each factory interface 107A-B each include an independent environmental control system with one or more inert gas delivery line, one or more exhaust line, and one or more sensors usable to measure one or more of humidity, O2 level, temperature, pressure, gas flow rates, and/or other parameters. Each environmental control system can adjust the gases and/or rates of gases flowed into the respective factory interface subsystem 107A-B and/or the rates of gases exhausted from the respective factory interface subsystems 107A-B based on the one or more measured parameters. In some embodiments, each factory interface subsystem 107A-B can further include a recirculation system that can filter gases exhausted from the factory interface and recirculate the filtered gasses back into the interior of the factory interface.

In the embodiment shown, each of the factory interface subsystems 107A-B can be provided with separate environmental controls providing an environmentally-controlled atmosphere therein. In particular, a first environmental control apparatus can be coupled to factory interface subsystem 107A and can be operational to monitor and/or control environmental conditions within the factory interface chamber of factory interface subsystem 107A. Similarly, a second environmental control apparatus can be coupled to factory interface subsystem 107B and can be operational to monitor and/or control environmental conditions within the factory interface chamber of factory interface subsystem 107B. In some embodiments, and at certain times, one or both of the interior volumes of the factory interface subsystems 107A-B can receive a purge gas (e.g., an inert and/or non-reactive gas) therein, such as, e.g., argon (Ar), nitrogen (N₂), helium (He), or clean dry air from a purge gas supply. The purge gas supply can be separately coupled by suitable conduits and one or more valves to the factory interface chambers of each of the factory interface subsystems 107A-B.

In more detail, the environmental control systems can control at least one of: 1) relative humidity (RH), 2) temperature (T), 3) an amount of oxygen (O₂), and/or 4) an amount of purge gas, within the respective factory interface chambers. Other environmental conditions of the factory interface chambers can be monitored and/or controlled, such as gas flow rate into the factory interface chambers, or pressure within the factory interface chambers, or both.

Each of load locks 120A-B can include one or more slit valves and/or doors configured to open when receiving or releasing substrates to and/or from factory interface robots 126A-B and transfer chamber robot 112. The slit valves and/or doors can be used to maintain a vacuum environment, a clean environment, and/or a temperature controlled environment. For example, the slit values and/or doors can be used to maintain a vacuum environment within the transfer chamber 110 and an inert gas environment within factory interface 106 (e.g., factory interface subsystems 107A-B). Load lock 120A can include one or multiple doors (not shown) which can grant access to factory interface robot 126A. Load lock 120B can include one or more doors (not shown) which can grant access to factory interface robot 126B.

In one embodiment side door 128A is approximately parallel to a backside of factory interface 106, and is also approximately perpendicular to door 130. Similarly, in one embodiment side door 128B is approximately perpendicular to the backside of factory interface 106, and is also approximately parallel to door 130.

In some embodiments, factory interface robots 126A-B can orient end effectors in a first direction that is pointed towards and approximately perpendicular to a front side of the factory interface when retrieving substrates from and/or placing substrates in containers 122A-F. In embodiments, factory interface robot 126A can orient one or more end effectors in a second direction that can be approximately parallel to the first direction when retrieving substrates from and/or placing substrates in load lock 120A. Similarly, factory interface robot 126B can orient one or more end effectors in a third direction that can be approximately parallel to the first direction when retrieving substrates from and/or placing substrates in load lock 120B.

In some embodiments, transfer chamber 110, process chambers 114, 116, and 118, and/or load locks 120A-B are maintained at a vacuum level. Electronic device manufacturing system 100 can include one or more vacuum ports that are coupled to one or more stations of electronic device manufacturing system 100. For example, vacuum ports 130 can be coupled to load locks 120A-B and disposed between load locks 120A-B and transfer chamber 110. In some embodiments, additional vacuum ports can be used. For example, further vacuum ports (not shown) can couple factory interface subsystems 107A-B to load locks 120A-B, respectively.

In some embodiments, one or more utility lines (not shown) are configured to provide utilities to each factory interface subsystem 107A-B. The utility lines can include respective power utility lines configured to provide power to factory interface subsystems 107A-B, respective air utility lines configured to provide air to factory interface subsystems 107A-B (e.g., a clean dry air (CDA) utility line), respective vacuum utility lines configured to provide a vacuum to vacuum ports 130 and/or to the interior chambers of the factory interface subsystems 107A-B, and/or respective nitrogen utility lines configured to provide nitrogen to factory interface subsystems 107A-B.

One or more utility cables can be configured to protect the one or more utility lines. For example, each utility line can be enclosed within a utility cable. Multiple utility lines can be enclosed within the same utility cable and/or utility lines can be included within separate utility cables. A first end of each utility cable can be mounted to an outlet of a utility supply (e.g., a power supply, an air supply, a vacuum pump, a nitrogen supply, etc.). In some embodiments, the outlet of a utility supply is connected to the floor (or a wall) of electronic device manufacturing system 100, 200. As such, the first end of each utility cable can be mounted to the ground of the fab (e.g., the ground over which the factory interface subsystems 107A-B are installed). A second end of each utility cable can be mounted to an inlet of factory interface subsystems 107A-B. In some embodiments, each inlet is located at a bottom of factory interface subsystems 107A-B. As such, the second end of each utility cable is mounted to the bottom of factory interface subsystems 107A-B.

Electronic device manufacturing system 100 can also include a system controller 140. Alternatively, a separate system controller 140 can be included for each of the factory interface subsystems 107A-B. System controller 140 can be and/or include a computing device such as a personal computer, a server computer, a programmable logic controller (PLC), a microcontroller, and so on. System controller 140 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 140 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). System controller 140 can include an environmental controller configured to control an environment (e.g., pressure, moisture level, vacuum level, etc.) within factory interface 106. In embodiments, execution of the instructions by system controller 140 causes system controller to perform the methods of one or more of FIGS. 6 and 7. System controller 140 can also be configured to permit entry and display of data, operating commands, and the like by a human operator.

System controller 140 can include suitable processor, memory, and electronic components for receiving inputs from various sensors and for controlling one or more valves to control the environmental conditions within the factory interface chambers of each of the factory interface subsystems 107A-B. System controller 140 can include an environmental control system that can, in one or more embodiments, monitor relative humidity (RH) by sensing RH in one or more of the factory interface subsystems 107A-B with one or more sensors. Any suitable type of sensor that measures relative humidity can be used, such as a capacitive-type sensor. The RH can be lowered by flowing a suitable amount of purge gas from the purge gas supply of the environmental control system into one or both of the factory interface chambers. In some embodiments, compressed bulk inert gases having low $H_2O$ levels (e.g., purity$\geq$99.9995%, $H_2O\leq$5 ppm) can be used as the purge gas supply in the environmental control system, for example. Other suitably low $H_2O$ levels can be used.

In another aspect, the sensor(s) can measure a plurality of environmental conditions. For example, in some embodiments, the sensor(s) can measure a relative humidity value. In one or more embodiments, a pre-defined reference relative humidity value can be less than 1000 ppm moisture, less than 500 ppm moisture, or even less than 100 ppm moisture, depending upon the level of moisture that is tolerable for the particular process being carried out in the system 100 or particular substrates exposed to the environment of one or both of the factory interface chambers.

The environmental monitor can also measure a level of oxygen ($O_2$) within one or more of the factory interface chambers. In some embodiments, a control signal from the system controller 140 to the environmental control apparatus initiating a flow of a suitable amount of purge gas from the purge gas supply into the appropriate factory interface chamber can take place to control the level of oxygen ($O_2$) to below a threshold $O_2$ value. In one or more embodiments, the threshold $O_2$ value can be less than 50 ppm, less than 10 ppm, or even less than 5 ppm, depending upon the level of $O_2$ that is tolerable (not affecting quality) for the particular process being carried out in the system 100 or particular substrates exposed to the environment of one of the factory interface chambers. In some embodiments, the sensor(s) can sense the level of oxygen in one of the factory interface chambers to ensure it is above a safe threshold level to allow entry into the factory interface chamber.

The sensor(s) can further measure the absolute or relative pressure within one of the factory interface chambers. In some embodiments, the system controller 140 can control the amount of flow of purge gas from a purge gas supply into one or both of the factory interface chambers to control the pressure in the respective factory interface chambers.

In the embodiments shown herein, the system controller 140 can include a processor, memory, and peripheral components configured to receive control inputs (e.g., relative humidity and/or oxygen) from the sensor(s) and to execute a closed loop or other suitable control scheme. In one embodiment, the control scheme can change a flow rate of the purge gas being introduced into the factory interface chamber(s) to achieve a predetermined environmental condition therein. In another embodiment, the control scheme can determine when to transfer substrates into an appropriate one of the factory interface chambers or when to open the door of a substrate carrier 122A-F.

As discussed above, factory interface subsystem 107A can be separated from factory interface subsystem 107B via partition 142. Partition 142 can include one or more opening to allow factory interface robot 126A to transfer one or more substrates to factory interface robot 126B, or vice-versa. Partition 142 can include one or more pass-through doors 150, 150A, 150B. For example, as shown in FIGS. 1A, 1B and 2, pass-through door 150 can be located on the right side of partition 142, within the volume of factory interface subsystem 107B. In another example, as shown in FIGS. 1C, 1D, 3A, and 3B, pass-through door 150A can be located on the left side of partition 142, and pass-through door 150B can be located on the right side of partition 142. In some embodiments (not shown), pass-through door 150 can be located on the left side of partition 142, within the volume of factory interface subsystem 107A. In the closed position, the pass-through door can maintain an airtight seal. As such, each of factory interface subsystem 107A and factory interface subsystem 107B can maintain individual atmospheres that are sealed off from one another. In the open position, the pass-through door can expose the pass-through area created by the opening in partition 142 to permit factory interface robot 126A and factory interface robot 126B to handoff substrates between each other.

Referring now to FIGS. 1A and 2, in some embodiments, factory interface subsystem 107A can include substrate pass-through station 144. It is noted that substrate pass-through station 144 is shown in factory interface subsystem 107A by way of example only, and that substrate pass-through station 144 can also be situated in factory interface subsystem 107B or in both factory interface subsystems 107A-B. Substrate pass-through station 144 can include one or more substrate platforms 146A, 146B, and elevation component 148. Substrate pass-through station 144 can facilitate the handoff of substrates between factory interface robot 126A and factory interface robot 126B. In one example, factory interface robot 126A can be configured to place a substrate onto substrate platform 146A or 146B, and factory interface robot 126B can retrieve the substrate via the opening in partition 142. In another example, factory interface robot 126B can be configured to place, via the opening in partition 142, a substrate onto substrate platform 146A or 146B, and factory interface robot 126A can retrieve the substrate. Elevation component 148 can be any mechanism (e.g., an electrical, mechanical, pneumatic, or hydraulic actuator, a valve system, an elevator system, etc.) be used to elevate and lower substrate platforms 146A, 146B. For example, Elevation component 148 can be configured to raise platforms 146A, 146B to a height such that factory interface robot 126B can place and/or retrieve a substrate through the opening in partition 142, and lower platforms 146A, 146B to a height such that substrate pass-through station 144 does not interfere with the factory interface robot 126A transferring substrates between load ports 124 and load lock 120A.

Figures 4A, 4B:
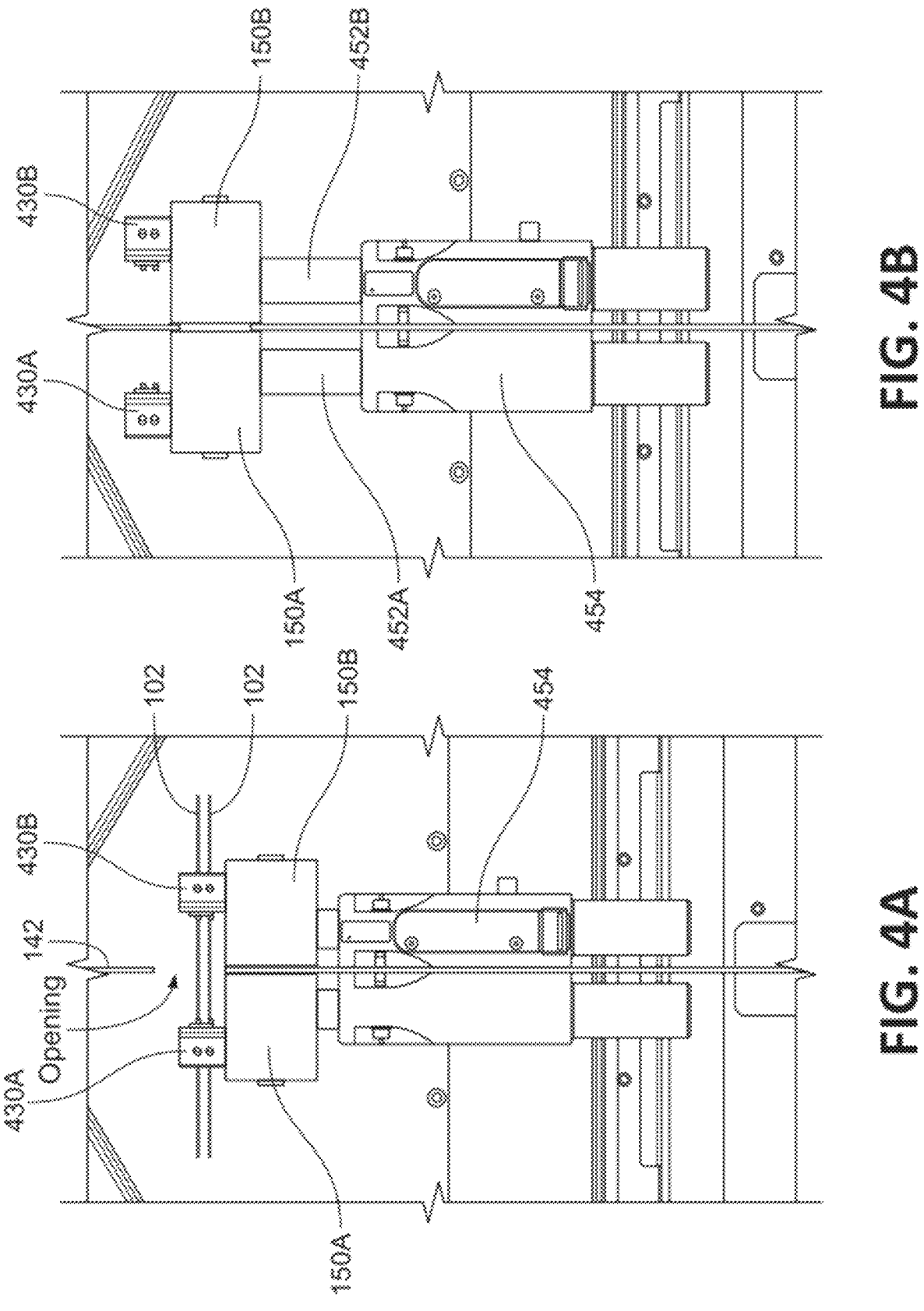
FIG. 4A illustrates a pair of pass-through doors in the open position, according to aspects of the present disclosure.
FIG. 4B illustrates a pair of pass-through doors in the closed position, according to aspects of the present disclosure.

Referring now to FIGS. 3A, 3B, 4A, and 4B, in some embodiments, the pass-through station can be a component of the pass-through doors. In particular, FIG. 4A illustrates pass-through doors 150A, 150B in the open position, and FIG. 4B illustrates the pass-through doors 150A, 150B in the closed position, in accordance with embodiments of the present disclosure. Pass-through doors 150A, 150B can be coupled to piston 452A, 452B, respectively. Piston 452A, 452B can be coupled to drive mechanism 454. Drive mechanism 454 can include one or more pneumatic devices, electromechanically driven devices, actuators, or similar mechanisms, where the drive mechanism 454 is capable of using compressed air or gasses, electricity, and/or a mechanical mechanism to raise and/or lower pistons 452A, 452B. As such, drive mechanism 454 can position the pass-through doors 150A, 150B into the open position and/or into the closed position.

Pass-through doors 150A, 150B can include pass-through station 430A, 430B, respectively. In some embodiments, pass-through station 430A, 430B can be situated on top of pass-through doors 150A-150B. In other embodiments, pass-through station 430A, 430B can be situated to the side of pass-through doors 150A-150B, or below pass-through doors 150A-150B. Pass-through station 430A, 430B can include one or more platforms, fins, brackets, shelves, or any other component configured to receive one or more substrates 102. In one embodiment, the pass-through station includes wafer fins, with a wafer stack of up to seven wafers. For example, as shown in FIG. 4A, pass-through station 430A, 430B includes a bracket configuration capable of receiving two substrates. In one example, factory interface robots 126A can position substrate 102 on pass-through station 430A, 430B, and factory interface robots 126B can retrieve substrate 102, and vice versa. Although FIGS. 4A-4B show two pass-through stations (430A, 430B), those skilled in the art would understand that any amount of pass-through stations can be coupled to pass-through doors 150A-150B. The pass-through doors may create an airtight seal on either side of the partition that separates the two factory interface subsystems 107A, 170B. A wafer pass-through station (not shown) may be located on top of the pass-through doors 150A, 150B. In some embodiments, the pass-through doors 150A, 150B open vertically (e.g., by sliding or swinging up and down). In some embodiments, the doors are L-shaped doors that have both a vertical and a horizontal stroke. The stroke of the doors may protect an independent wafer pass-through station positioned in the opening of the partition. For this configuration, the right door can open to allow the right robot to access the pass-through station and the left door can open to allow the left robot access to the pass-through station. In some embodiments, if both doors are closed, the two independent EFEM volumes are separated and the pass-through station can't be accessed.

In some embodiments, each pass-through station 430A, 430B can independently hold one or more substrates. In such embodiments, when one pass-through door (e.g., pass-through door 150A) is closed and the other pass-through door (e.g., pass-through door 150B) is open, the factory interface robot of the factory interface subsystem with the open pass-through door (e.g., factory interface robot 126B) can position and/or remove substrate from the pass-through station 430B.

When the doors are down, the wafer pass-through station may be made available. When the doors are up, the partition opening may be sealed and the pass-through station may be unavailable.

Figure 5B:
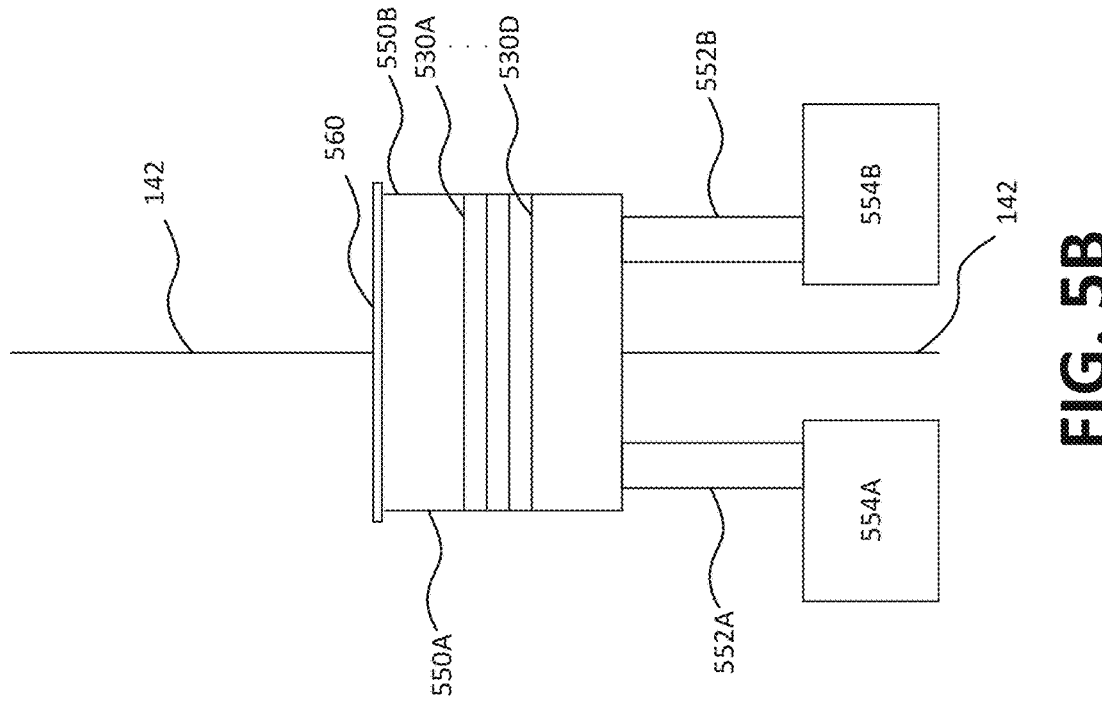
FIG. 5B illustrates another pair of pass-through doors in the closed position, according to aspects of the present disclosure.
Figure 5A:
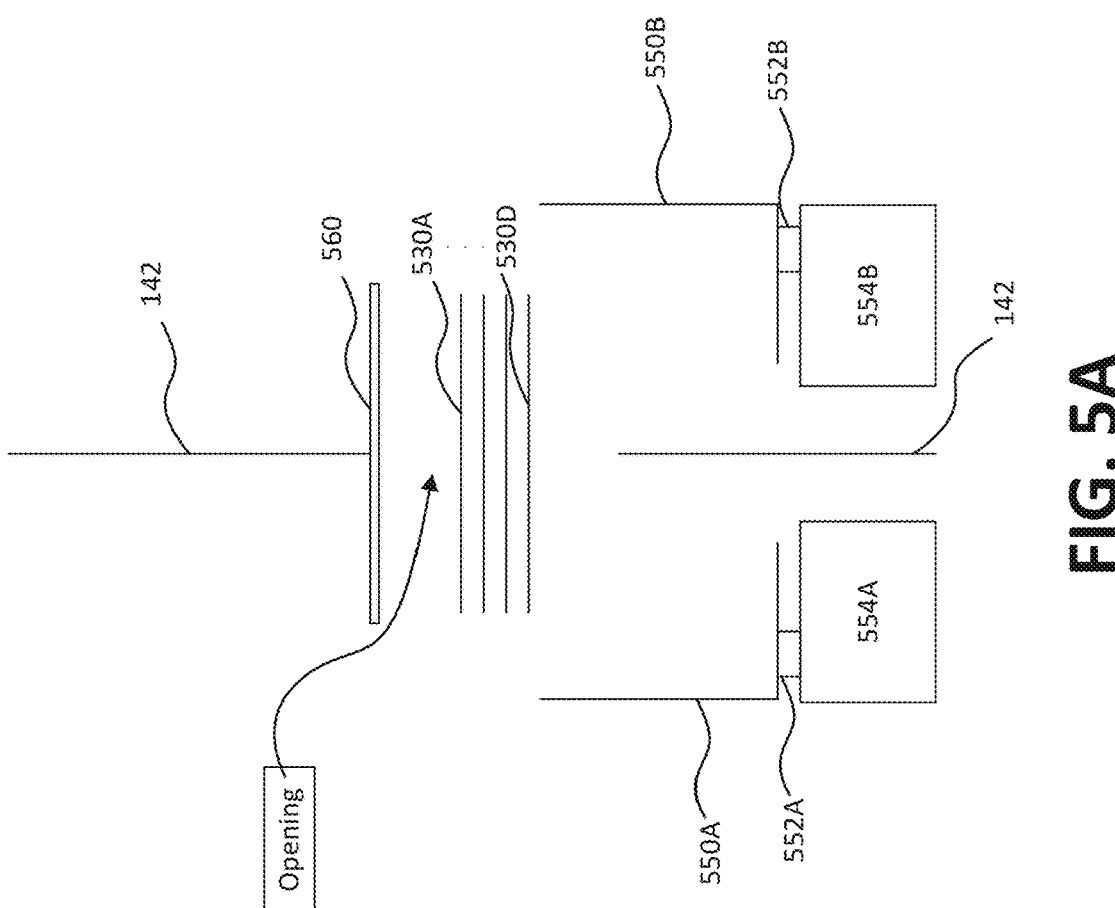
FIG. 5A illustrates another pair of pass-through doors in the open position, according to aspects of the present disclosure.

FIGS. 5A-5B illustrate another embodiment having a pair of pass-through doors 550A, 550B with a set of pass-through stations 530A-530D positioned in the opening of partition 142. In particular, FIG. 5A illustrates pass-through doors 550A, 550B in the open position, and FIG. 5B illustrates the pass-through doors 550A, 550B in the closed position, in accordance with embodiments of the present disclosure. Pass-through doors 550A, 550B can each be an L-shaped door. Pass-through doors 550A, 550B can be coupled to piston 552A, 552B, respectively. Piston 552A, 552B can be coupled to drive mechanism 554A, 554B, respectively. Drive mechanism 554A, 554B can include one or more pneumatic devices, electromechanically driven devices, actuators, or similar mechanisms, where the drive mechanism 554A, 554B is capable of using compressed air or gasses, electricity, and/or a mechanical mechanism to raise and/or lower pistons 552A, 552B, move pistons 552A, 552B in a horizontal motion, rotate pistons 552A, 552B, or any combination thereof. As such, drive mechanism 554A, 554B can position the pass-through doors 550A, 550B into the open position and/or into the closed position. In one example, drive mechanism 554A, 554B can move piston 552A, 552B, respectively, horizontally towards partition 142, then elevate piston 552A, 552B vertically towards partition top 560. In another example, drive mechanism 554A, 554B can elevate piston 552A, 552B vertically towards partition top 560, then move piston 552A, 552B, respectively, horizontally towards partition 142. In some embodiments, partition top 560 and/or pass-through doors 550A, 550B can include one or more seals capable of providing an airtight seal. For example, in the closed position, pass-through door 550A, 550B can each form a seal with partition 142 via the bottom portion of pass-through door 550A, 550B, and with partition top 560 via the top portion of pass-through door 550A, 550B. Pass-through doors 550A, 550B can be opened and closed independently of each other. For example, pass-through doors 550A can be in the open position while pass-through door 550B is in the closed position, and vice versa.

Pass-through station 530A, 530B can be coupled to partition top 560, to a wall of factory interface subsystems 107A, 107B, or to any other portion of electronic device manufacturing system 100, 102. Each pass-through station can include substrate platform for receiving one or more substrates. In one example, factory interface robots 126A can position substrate 102 on pass-through station 530A, 530B, 530C, and/or 530D, and factory interface robots 126B can retrieve substrate 102, and vice versa. Although FIGS. 5A-5B show four pass-through stations (530A-530D, 430B), those skilled in the art would understand that any amount of pass-through stations can be used.

Returning to FIGS. 1A-1D, Factory interface 106 can include one or more auxiliary components 170 that are accessible by the factory interface robots 126A-B and are part of the factory interface subsystems 107A-B mini-environments. The auxiliary components 170 can include substrate wafer storage stations, metrology stations, cool down stations, servers, or any other substrate pre-processing or post-processing stations. A substrate storage container can store substrates and/or substrate carriers (e.g., FOUPs), for example. Metrology equipment can be used to determine property data of the products that were produced by the electronic device manufacturing system 100. In some embodiments, factory interface robots can 126A-B access auxiliary components 170. For example, factory interface robots can 126A-B can place a substrate within or on auxiliary component 170, retrieve a substrate from auxiliary component 170, etc. In some embodiments, factory interface subsystem 107A can include upper compartment 160A, and factory interface subsystem 107B can include upper compartment 160B, as seen in FIGS. 1B, 1D and 2. Upper compartments 160A-B can house electronic systems (e.g., servers, air conditioning units, etc.), utility cables, system controller 140, or other components.

Factory interface 106 can include one or more access doors 134A, 134B, which can be used to inspect or perform maintenance on load locks 120A-B, factory interface robots 126A-B, or other components. In some embodiments, factory interface subsystem 107A can include side access doors 134A and factory interface subsystem 107B can include side access doors 134B.

Referring now to FIGS. 2, 3A, and 3B, each factory interface sub-system 107A-B can include one or more substrate storage stations 152A-D and/or one or more alignment pedestals 154A-B. A substrate storage station 152A-B can include one or more slots to store substrates. For example, factory interface robot 126A can retrieve a substrate from load lock 120A or a substrate carrier and place the substrate onto one of the slots of substrate storage station 152A or 152B, and vice versa. Similarly, factory interface robot 126B can retrieve a substrate from load lock 120B or a substrate carrier and place the substrate onto one of the slots of substrate storage station 152C or 152D, and vice versa.

The alignment pedestals 154A-B can include devices that orient the substrates to a predetermined direction. For example, the alignment pedestals 154A-B can optically scan the substrate 102 and identify notches (not shown) located on the substrate 102. The alignment pedestals 154A-B can then align the substrate 102 by rotating the substrate 102 until the notches are oriented to predetermined directions. Examples of alignment procedures and alignment pedestals are described in U.S. Pat. Nos. 3,972,424; 5,102,280; and 6,275,742.

In a descriptive example, factory interface 106 includes a plurality of sides which comprise a back side that is configured to face transfer chamber 110 of the electronic device manufacturing system 100, a front side, a right side, and a left side. A first factory interface robot (e.g., factory interface robot 126A) is disposed within the interior volume of factory interface subsystem 107A proximate to the left side of factory interface 106, and a second factory interface robot (e.g., factory interface robot 126B) is disposed within the interior volume of factory interface subsystem 107B proximate to the right side of factory interface 106. A first load lock (e.g., load lock 120A) and a second load lock (e.g., load lock 120B) are disposed adjacent to the back side and behind the first factory interface robot and the second factory interface robot such that the first load lock is nearer to the first factory interface robot than the second load lock and the second load lock is nearer to the second factory interface robot than the first load lock. Factory interface subsystem 107A includes a first set of load ports (e.g., one or more of load ports 124) for receiving the first set of substrate carriers (e.g., one or more of substrate carriers 122A-C), where the first set of load ports are positioned at a first portion of the front side that is proximate to the left side. Factory interface subsystem 107B includes a second set of load ports (e.g., one or more of load ports 124) for receiving the second set of substrate carriers (e.g., one or more of substrate carriers 122D-F), where the second set of load ports are positioned at a second portion of the front side that is proximate to the right side. Factory interface 106 can include at least one of a substrate storage container or metrology equipment positioned below a load port 122 of the first set of load ports or the second set of load ports.

In some embodiments, a factory operator can access factory interface robots 126A-B, load ports 124, load locks 120A-B, substrate pass-through station 144, upper compartments 160A-B, or any other components for maintenance or repair without shutting down the entire factory interface 106. In particular, a factory operator can perform maintenance on factory interface robot 126A, the first set of load ports 124, load lock 120A, substrate pass-through station 144, substrate storage station 152A, alignment pedestal 154A, and/or upper compartment 160A while factory interface subsystem 107B, and its components, remains fully operational. Similarly, the factory operator can perform maintenance on factory interface robot 126B, the second set of load ports 124, load lock 120B, pass-through door 150, substrate storage station 152A, alignment pedestal 154A, and/or upper compartment 160B while factory interface subsystem 107A, and its components, remains fully operational.

Figure 6:
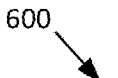
FIG. 6 is a method for transporting substrates from a substrate carrier to a factory interface, in accordance with embodiments of the present disclosure.
Figure 6:
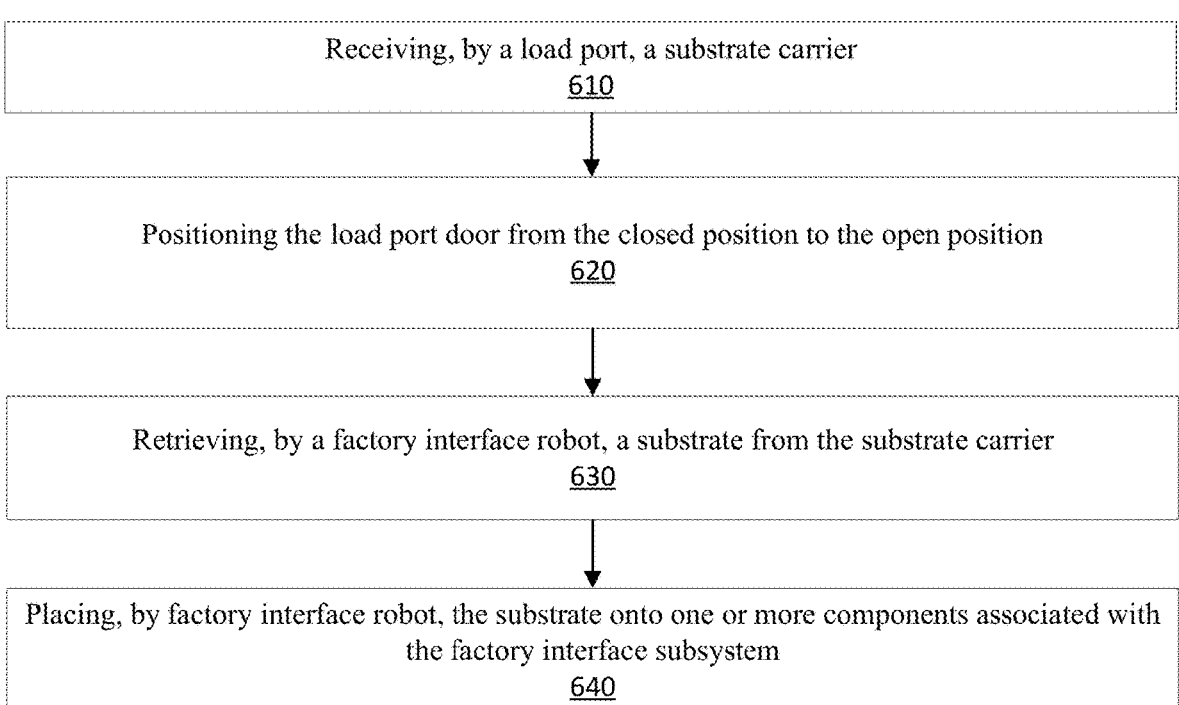

FIG. 6 is a flow chart of a method 600 for transporting substrates from a substrate carrier to a factory interface subsystem, in accordance with embodiments of the present disclosure. Method 600 is performed by processing logic that can include hardware (circuitry, dedicated logic, etc.), software (such as is run on a general purpose computer system or a dedicated machine), firmware, or some combination thereof. In one implementation, method 600 can be performed by a computer system, such as system controller 140 of FIG. 1. In other or similar implementations, one or more operations of method 600 can be performed by one or more other machines not depicted in the figures.

At operation 610, a load port receives a substrate carrier. In an example, the substrate carrier is a FOUP. In some embodiments, the load port includes a frame adapted for connecting the load port to the factory interface. The frame includes a transport opening through which one or more substrates are capable of being transported between the substrate carrier and the factory interface. The load port also includes an actuator coupled to the frame and a load port door coupled to the actuator. The load port door can be configured to seal the transport opening. The actuator is capable of positioning the load port door from a closed position to an open position, and from the open position to the closed position.

At operation 620, the load port door is positioned from closed position to the open position via, for example, the door mechanism operated by the load port controller.

At operation 630, a factory interface robot deposed within the factory interface subsystem retrieves a substrate from the substrate carrier. In some embodiment, the factory interface robot can engage the vertical drive mechanism to position the end effector to horizontal plane associated with the load port.

At operation 640, the factory interface robot can place the substrate onto one or more components associated with the factory interface subsystem. For example, the factory interface robot can place the substrate onto a substrate pass-through station, a load port, an alignment pedestal, a slot of a substrate storage station, a substrate carrier, or handoff the substrate to another factory interface robot.

Figure 7:
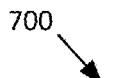
FIG. 7 is a method for method for transporting substrates from a first factory interface robot to a second factory interface robot, in accordance with embodiments of the present disclosure.
Figure 7:
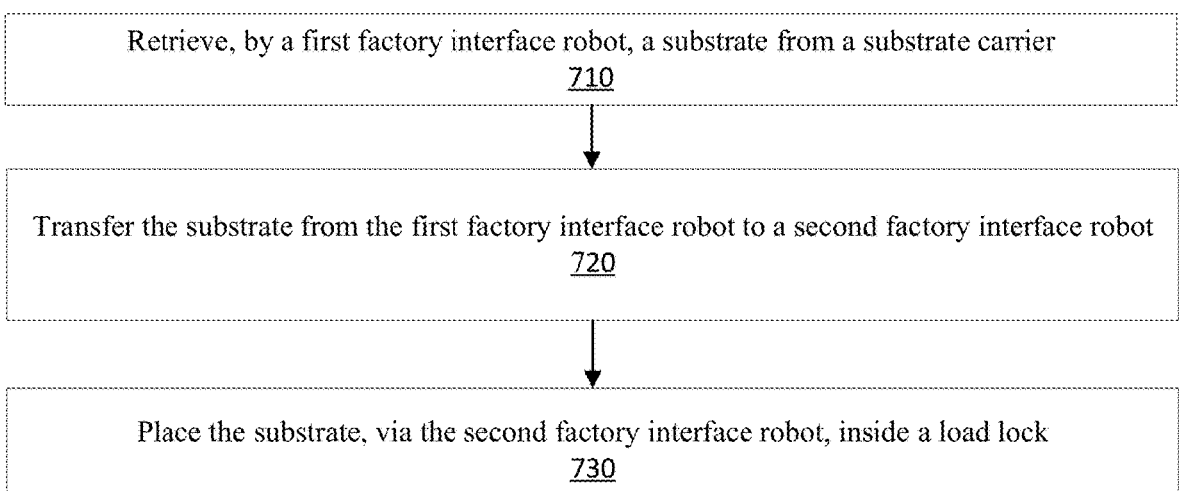

FIG. 7 is a flow chart of a method 700 for transporting substrates from a first factory interface robot to a second factory interface robot, in accordance with embodiments of the present disclosure, in accordance with embodiments of the present disclosure. Method 700 is performed by processing logic that can include hardware (circuitry, dedicated logic, etc.), software (such as is run on a general purpose computer system or a dedicated machine), firmware, or some combination thereof. In one implementation, method 700 can be performed by a computer system, such as system controller 140 of FIG. 1. In other or similar implementations, one or more operations of method 700 can be performed by one or more other machines not depicted in the figures At operation 710, a first factory robot retrieves a substrate from a substrate carrier. In an example, the substrate carrier is a FOUP.

At operation 720, the first factory interface robot transfers the substrate to a second factory robot. In an example, the first factory robot is disposed within a first factory interface subsystem and the second factory robot is disposed within a second factory interface subsystem. The first factory robot and/or the second factory robot can engage a respective mechanism to adjust the position of the end effector to a predetermined position associated with retrieving, transporting or transferring substrates. The first factory interface robot can be configured to transfer the substrate to the second factory interface robot using a pass through area in the partition between the first factor interface subsystem and the second factory interface subsystem. In some embodiments, processing logic can first open a pass-through door to enable the transfer of the substrate from the first factory interface robot to the second factory interface robot. The first factory interface robot can be configured to transfer the substrate to the second factory interface robot through the pass through area. In another example, the first factory robot can place the substrate on the substrate pass-through station. Once placed, the second factory interface robot can retrieve the substrate from the substrate pass-through station.

At operation 730, the second factory interface robot places the substrate inside a load lock coupled to the factory interface. In some embodiments, the load lock cannot be accessed by the first factory interface robot. In an example, the second factory robot can retrieve a substrate from inside the load lock disposed within the second factory interface subsystem. The second factory robot can then transfer the substrate to the first factory robot. The second factory interface robot can be configured to transfer the substrate to the first factory interface robot using the pass-through area. The first factory robot can then place the substrate within the substrate carrier.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate processing system, comprising:
a factory interface forming a first interior volume;
a partition disposed in the factory interface, wherein the partition divides the first interior volume into a first factory interface chamber forming a second interior volume, and a second factory interface chamber forming a third interior volume, wherein the partition is configured to provide a first sealed environment in the first factory interface chamber and a second sealed environment in the second factory interface chamber;
a first load lock coupled to the first factory interface chamber;
a second load lock coupled to the second factor interface chamber; and
a transfer chamber coupled to the first load lock and to the second load lock.

2. The substrate processing system of claim 1, wherein the partition comprises an opening, and further comprising:
a first door disposed in the first factory interface chamber, wherein the first door is configured to cover the opening while closed to separate the second interior volume from the third interior volume and to provide at least one of the first sealed environment in the first factory interface chamber or the second sealed environment in the second factory interface chamber.

3. The substrate processing system of claim 2, further comprising:
a second door disposed in the second factory interface chamber, wherein the second door is configured to cover the opening while closed to separate the second interior volume from the third interior volume and to provide at least one of the first sealed environment in the first factory interface chamber or the second sealed environment in the second factory interface chamber.

4. The substrate processing system of claim 2, wherein the partition comprises a substrate pass-through station for passing substrates between the first factory interface chamber and the second factory interface chamber.

5. The substrate processing system of claim 4, wherein a first factory interface robot is configured to at least one of place a substrate onto the substrate pass-through station or retrieve the substrate from the substrate pass-through station.

6. The substrate processing system of claim 3, wherein a substrate pass-through station is positioned between the first and second door.

7. The substrate processing system of claim 2, wherein the first door is an L-shaped door capable of vertical and horizontal movement.

8. The substrate processing system of claim 1, further comprising:
a first factory interface robot disposed within the second interior volume of the first factory interface chamber; and
a second factory interface robot disposed within the third interior volume of the second factory interface chamber.

9. The substrate processing system of claim 8, wherein:
the first load lock is accessible by the first factory interface robot; and the second load lock is accessible by the second factory interface robot.

10. The substrate processing system of claim 8, further comprising:
a first set of load ports coupled to the first factory interface chamber for receiving a first set of substrate carriers, wherein the first set of load ports are positioned to be accessible by the first factory interface robot; and
a second set of load ports coupled to the second factory interface chamber for receiving a second set of substrate carriers, wherein the second set of load ports are positioned to be accessible by the second factory interface robot.

11. The substrate processing system of claim 1, further comprising:
a first compartment housing electronic systems associated with the first factory interface chamber; and
a second compartment housing electronic systems associated with the second factory interface chamber.

12. The substrate processing system of claim 8, further comprising:
a substrate pass-through station situated in at least one of the first factory interface chamber or the second factory interface chamber for passing substrates between the first factory interface chamber and the second factory interface chamber, wherein the first factory interface robot is configured to at least one of place a substrate onto the substrate pass-through station or retrieve the substrate from the substrate pass-through station.

13. The substrate processing system of claim 12, wherein the substrate pass-through station comprises at least one substrate platform and an elevation component.

14. The substrate processing system of claim 1, further comprising:
a first alignment pedestal disposed within the second interior volume of the first factory interface chamber; and
a second alignment pedestal disposed within the third interior volume of the second factory interface chamber.

15. The substrate processing system of claim 1, further comprising:
a first recirculation system for recirculating gases within the second interior volume of the first factory interface chamber; and
a second recirculation system for recirculating gases within the third interior volume of the second factory interface chamber.

16. An electronic device manufacturing system, comprising:
a first factory interface subsystem;
a second factory interface subsystem;
a partition positioned so as to be between the first factory interface subsystem and the second factory interface subsystem, wherein the partition comprises an opening;
a first load lock coupled to a backside of the first factory interface subsystem and coupled to a transfer chamber;
a second load lock coupled to a backside of the second factory interface subsystem and coupled to the transfer chamber;
a first factory interface robot disposed within an interior volume of the first factory interface subsystem; and
a second factory interface robot disposed within an interior volume of the second factory interface subsystem, wherein:

the first factory interface robot is configured to transfer a substrate to the second factory interface robot via the opening in the partition.

17. The electronic device manufacturing system of claim 16, wherein the partition is configured to provide a first sealed environment in the first factory interface subsystem and a second sealed environment in the second factory interface subsystem.

18. The electronic device manufacturing system of claim 16, further comprising:

a first door situated within the first factory interface subsystem and configured to cover the opening to provide a first sealed environment in the first factory interface subsystem and a second sealed environment in the second factory interface subsystem; and a second door situated within the second factory interface subsystem and configured to cover the opening to provide the first sealed environment in the first factory interface subsystem and the second sealed environment in the second factory interface subsystem.

19. The electronic device manufacturing system of claim 16, further comprising:

a substrate pass-through station situated in the first factory interface subsystem, wherein the first factory interface robot is configured to at least one of place a substrate onto substrate pass-through station or retrieve the substrate from the substrate pass-through station.

20. The electronic device manufacturing system of claim 16, wherein the partition comprises a substrate pass-through station for passing substrates between the first factory interface subsystem and the second factory interface subsystem.

21. The electronic device manufacturing system of claim 16, wherein the first factory interface subsystem is configured to perform operations in view of at least one of a failure to a component of the second factory interface subsystem or a shutdown of the second factory interface subsystem.

* * * * *